United States Patent [19]

Kurono et al.

[11] Patent Number: 5,440,206

[45] Date of Patent: Aug. 8, 1995

[54] PLASMA PROCESSING APPARATUS COMPRISING MEANS FOR GENERATING ROTATING MAGNETIC FIELD

[75] Inventors: Yoichi Kurono; Masami Kubota, both of Nakakoma; Hiroyuki Yoshiki, Toyonaka; Michio Taniguchi, Kobe, all of Japan

[73] Assignees: Tokyo Electron Ltd.; Tokyo Electron Yamanashi and Daihen Corporation, both of Japan

[21] Appl. No.: 81,023

[22] Filed: Jun. 22, 1993

[30] Foreign Application Priority Data

Jun. 26, 1992 [JP]  Japan .................................. 4-193164

[51] Int. Cl.$^6$ ................................................. H01J 7/24
[52] U.S. Cl. ............................ 315/111.41; 315/111.21; 315/137; 315/34.8
[58] Field of Search ....................... 315/111.21, 111.41, 315/137, 344, 348

[56] References Cited

U.S. PATENT DOCUMENTS

| | | | |
|---|---|---|---|
| 4,829,215 | 5/1989 | Kim et al. ............... | 315/111.41 |
| 4,863,671 | 9/1989 | Okada ...................... | 376/143 |
| 4,950,956 | 8/1990 | Asamaki et al. ........ | 315/111.21 |
| 5,208,512 | 5/1993 | Forster et al. ........... | 315/111.21 |

Primary Examiner—Robert J. Pascal
Assistant Examiner—Darius Gambino
Attorney, Agent, or Firm—Scully, Scott, Murphy & Presser

[57] ABSTRACT

In a plasma processing s including a processing chamber and plate-parallel electrodes, provided in the processing chamber, for generating a high-frequency electric field in response to a high-frequency voltage, a ring-shaped core is provided in the periphery of the processing chamber, and a toroidal coil includes a plurality of 2n split coils wound in all the periphery of the ring-shaped core so that each pair of split coils oppose to each other. An alternating-current power source for generating a plurality of n-phase alternating-current currents including a plurality of n currents having a phase difference of either $\pi/n$ or $2\pi/n$ therebetween, is electrically connected with the plurality of split coils of the toroidal coil so that two magnetic fields generated by the each pair of split coils opposing to each other are directed in the same direction in parallel to each other in the processing chamber, and the plurality of currents are respectively flowed into the respective pairs of split coils opposing to each other, thereby generating a rotating magnetic field in parallel to surfaces of the plane-parallel electrodes.

2 Claims, 9 Drawing Sheets

PLASMA PROCESSING APPARATUS COMPRISING MEANS FOR GENERATING ROTATING MAGNETIC FIELD

BACKGROUND OF THE INVENTION

1. Field of the Invention

The present invention relates to a plasma processing apparatus, and more particularly, to a plasma processing apparatus comprising means for generating a rotating magnetic field using a polyphase alternating-current.

2. Description of the Prior Art

Conventionally, a plasma processing apparatus generates a plasma due to an electric discharge between plane-parallel electrodes provided within a processing chamber, and performs processes using the generated plasma such as a process for forming thin films on a surface of a processing substrate, a reforming process, an etching process or the like.

Recently, the following plasma processing apparatus (referred to as a conventional plasma processing apparatus hereinafter) has been suggested in, for example, the Japanese patent laid-open publication No. 61-86942. In the conventional plasma processing apparatus, in order to uniformly process the whole processing surface of a processing substrate in a high speed accompanying larger dimensions of the processing substrates, there are provided a plurality of sets of Helmholtz coils in the periphery of a processing chamber, and a rotating magnetic field is generated at an area close to the processing surface of the processing substrate by symmetrical three-phase alternating-current so as to be parallel to the processing surface thereof.

FIG. 6 schematically shows the conventional plasma processing apparatus.

Referring to FIG. 6, there is provided in a processing chamber 1 having a cylindrical shape, an anode electrode 2 and a cathode electrode 3 which are plane-parallel electrodes, wherein the anode electrode 2 is electrically connected to ground. The cathode electrode 3 is connected through a coupling capacitor 4 to a high frequency power source 5, and a processing substrate 6 is placed on the cathode electrode 3 axially to the processing chamber 1.

In the periphery of the processing chamber 1, there are provided three sets of Helmholtz coils used as means 7 for generating a rotating magnetic field, and each set of Helmholtz coils is comprised of a pair of air-core ring-shaped coils which oppose to each other so that the respective directions of the magnetic fields respectively generated by a pair of air-core ring-shaped coils are parallel to each other.

FIG. 7 shows an arrangement of means 7 for generating the rotating magnetic field comprising three sets of Helmholtz coils 71, 72 and 73.

Referring to FIG. 7, a first set of Helmholtz coils 71 is constituted by a pair of ring-shaped coils 71a and 71b, a second set of Helmholtz coils 72 is constituted by a pair of ring-shaped coils 72a and 72b, and a third set of Helmholtz coils 73 is constituted by a pair of ring-shaped coils 73a and 73b. As shown in FIG. 7, respective sets of Helmholtz coils 71 to 73 are provided so that the positions thereof are rotated by an angle of 120 degrees about the center 6c of the circular-plane-shaped processing substrate, and the central axes f of the coils opposing to each other pass through an area close to the processing surface of the processing substrate 6.

In the above-mentioned Japanese patent laid-open publication No. 61-86942, the winding directions of the Helmholtz coils and the electrical connections between the Helmholtz coils are not shown and also are not described. However, generally, the winding directions of the Helmholtz coils and the electrical connections between the Helmholtz coils are as follows. The winding directions of a pair of coils are the same as each other. Further, for example, the winding completion end of the coil 71a is electrically connected to the winding start end of the coil 71b, and the winding start end of the coil 71a and the winding completion end of the coil 71b are electrically connected to a symmetrical three-phase alternating-current power source for generating a rotating magnetic field. Furthermore, the other coils 72a, 72b, 73a and 73b are electrically connected in manners similar to those as described above.

When processing the processing substrate using the plasma processing apparatus constituted as described above, after a gas within the processing chamber 1 is discharged through an exhaust gas port 1a, a desirable processing gas is introduced through a gas entrance port 1b, and then the pressure of the processing gas within the processing chamber 1 is kept to be a predetermined constant pressure.

Further, a high frequency voltage is applied between the anode electrode 2 and the cathode electrode 3, and simultaneously, respective-phase currents I1, I2 and I3 represented by the following equations (1), (2) and (3) are respectively flowed into the three sets of Helmholtz coils 71, 72 and 73, which are provided so that the spatial angle therebetween becomes $2\pi/3$ as described above, from a commercial symmetrical three-phase alternating-current power source for generating a magnetic field.

$$I1 = I \sin \omega t \quad (1)$$

$$I2 = I \sin (\omega t - 2\pi/3) \quad (2)$$

$$I3 = I \sin (\omega t - 4\pi/3) \quad (3)$$

Then, a circular rotating magnetic field comprised of a combined magnetic field having a magnetic field intensity H represented by the following equation (4) is generated in a clockwise direction about the center 6c of the processing substrate 6.

$$H = (3/2)Hm \quad (4),$$

where Hm is the maximum value of the magnetic field intensity generated by one set of Helmholtz coils 71, or 73.

As described above, the rotating magnetic field of the combined magnetic field H having the constant magnitude over a wide area is generated in an area close to the processing surface of the processing substrate 6 in parallel to both the electrodes 2 and 3, namely, in parallel to the processing substrate 6, so as to be rotated about the center 6c of the processing substrate 6. Then, a plasma having a high density is uniformly generated, and the processing substrate is processed with a high uniformity in a high speed.

In the above-mentioned conventional apparatus, in order to improve the uniformity of the distribution of the magnetic field in a direction directed to the rim peripheral end of the processing substrate from the center thereof, each of the Helmholtz coils has a size of a window remarkably larger than the diameter of the processing substrate 6. Therefore, it is necessary to provide a large-sized coils, resulting in the large-sized plasma processing apparatus. Further, since each of the Helmholtz coils is an air-core coil in addition to these requirements, the conventional plasma processing apparatus consumes a remarkably large electric power.

Further, as shown in FIG. 7, since the Helmholtz coils are provided so that each of the adjacent coils projects from the window of the coil, it is necessary to manufacture three kinds of coils for respective phases, the sizes of which are different from each other, resulting in a more expensive manufacturing cost.

SUMMARY OF THE INVENTION

An object of the present invention is therefore to provide a small-sized plasma processing apparatus capable of generating a rotating magnetic field with a smaller consumption electric power, as compared with the conventional plasma processing apparatus.

In order to achieve the aforementioned objective, according to one aspect of the present invention, there is provided a plasma processing apparatus comprising:
 a processing chamber;
 plate-parallel electrodes, provided in said processing chamber, for generating a high-frequency electric field in response to a high-frequency voltage;
 power source means for generating a plurality of n-phase asymmetrical alternating-current currents including a plurality of n currents having a phase difference of $\pi/n$ therebetween;
 a ring-shaped core provided in the periphery of said processing chamber;
 a toroidal coil including a plurality of 2n split coils wound in all the periphery of said ring-shaped core so that each pair of split coils oppose to each other; and
 electrical connection means for electrically connecting said power source means with said plurality of split coils of said toroidal coil so that two magnetic fields generated by said each pair of split coils opposing to each other are directed in the same direction in parallel to each other in said processing chamber, and said plurality of currents are respectively flowed into said respective pairs of split coils opposing to each other, thereby generating a rotating magnetic field in parallel to surfaces of said plane-parallel electrodes.

According to another aspect of the present invention, there is provided a plasma processing apparatus comprising:
 a processing chamber;
 plate-parallel electrodes, provided in said processing chamber, for generating a high-frequency electric field in response to a high-frequency voltage;
 power source means for generating a plurality of n-phase symmetrical alternating-current currents including a plurality of n currents having a phase difference of $2\pi/n$ therebetween;
 a ring-shaped core provided in the periphery of said processing chamber;
 a toroidal coil including a plurality of 2n split coils wound in all the periphery of said ring-shaped core so that each pair of split coils oppose to each other; and
 electrical connection means for electrically connecting said power source means with said plurality of split coils of said toroidal coil so that two magnetic fields generated by said each pair of split coils opposing to each other are directed in the same direction in parallel to each other in said processing chamber, and said plurality of currents are respectively flowed into said respective pairs of split coils opposing to each other, thereby generating a rotating magnetic field in parallel to surfaces of said plane-parallel electrodes.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

Figure 12:
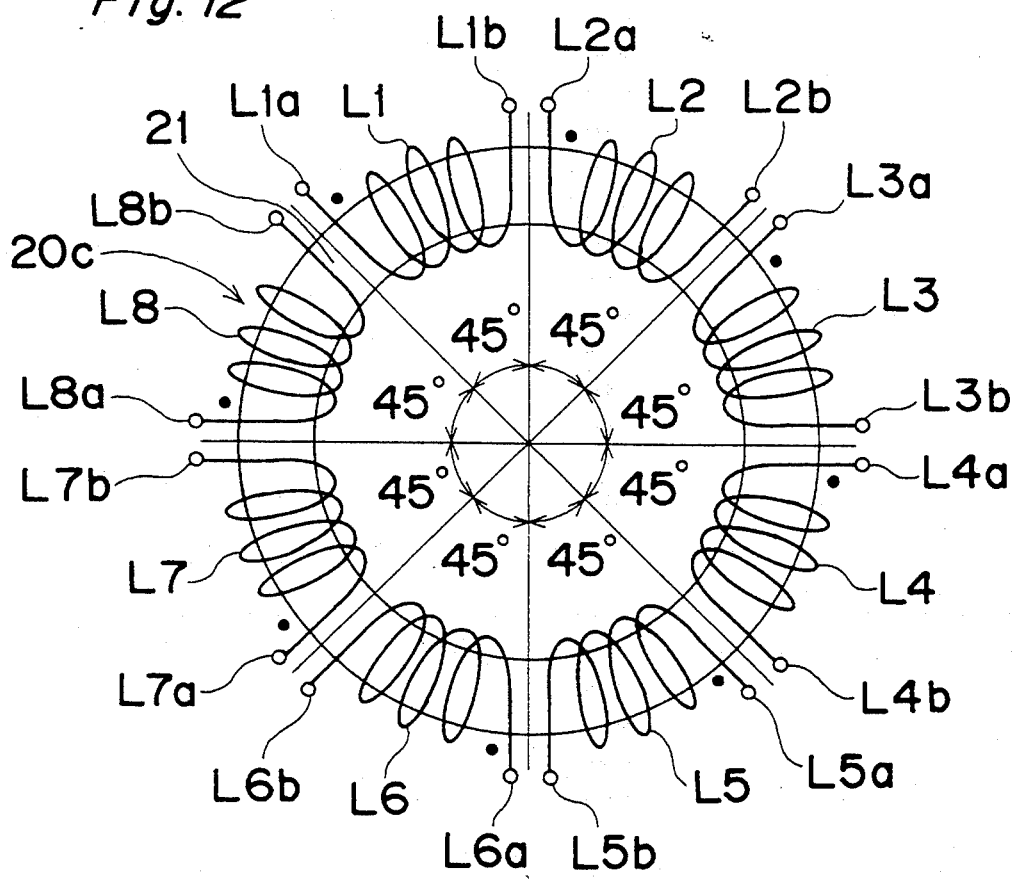
Figure 13:
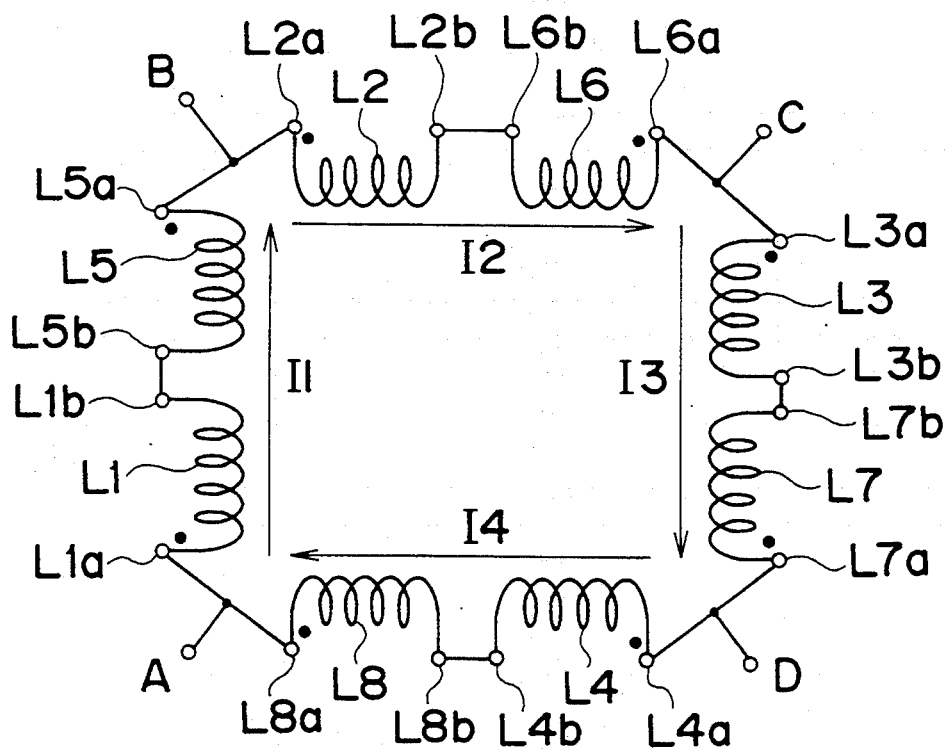
Figure 14:
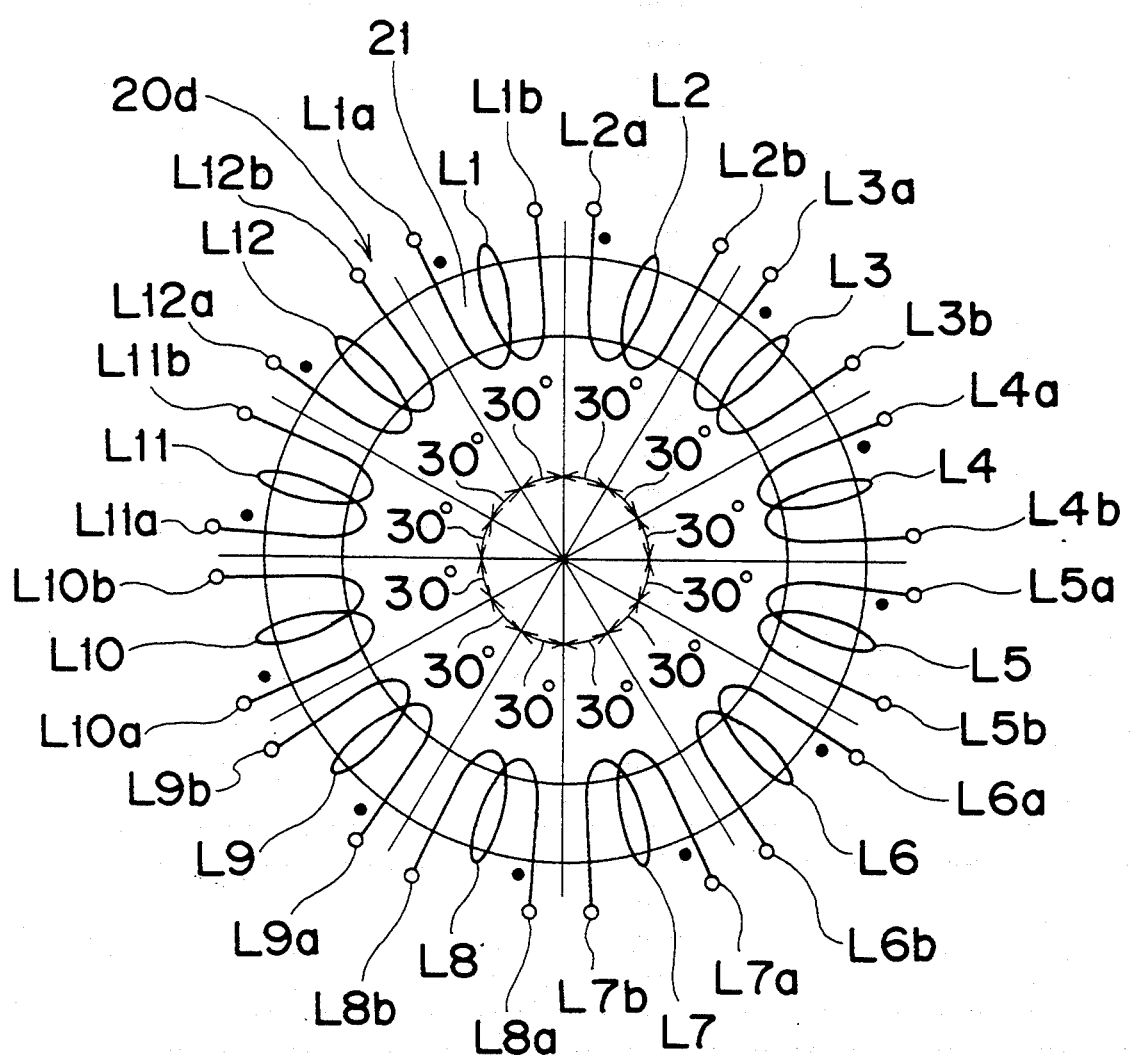
Figure 15:
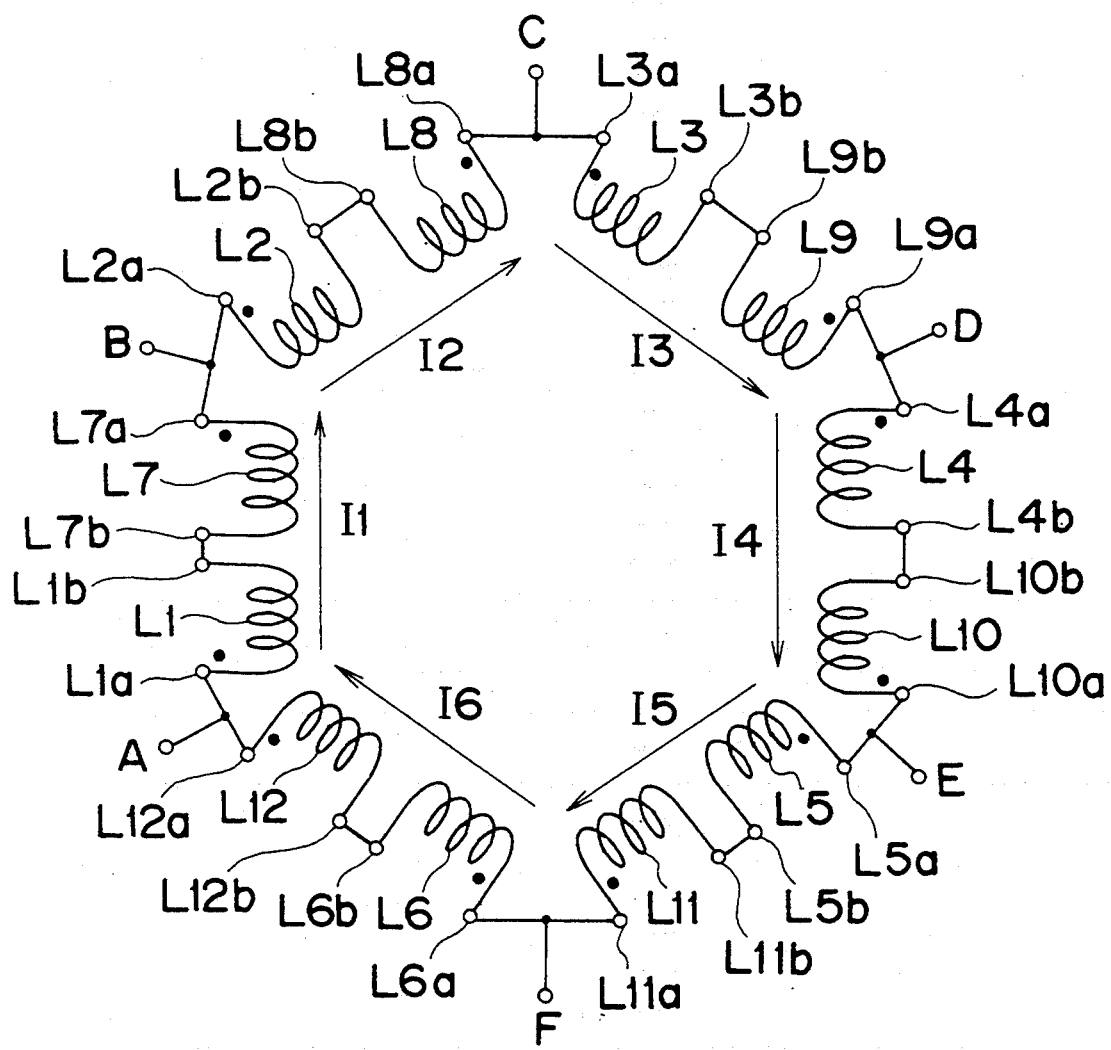

FIG. 12 is a plan view schematically showing a toroidal coil 20c comprising eight split coils L1 to L8 of a plasma processing apparatus of a third preferred embodiment using an asymmetrical four-phase alternating-current power source, according to the present invention;

FIG. 13 is a circuit diagram of the toroidal coil 20c showing a method of electrically connecting the eight split coils L1 to L8, and a method of flowing currents I1 to I4 of four-phase alternating-current into the eight split coils L1 to L8;

FIG. 14 is a plan view schematically showing a toroidal coil 20d comprising twelve split coils L1 to L12 of a plasma processing apparatus of a fourth preferred embodiment, using an asymmetrical six-phase alternating-current power source, according to the present invention; and FIG. 15 is a circuit diagram of the toroidal coil 20d showing a method of electrically connecting the twelve split coils L1 to L12, and a method of flowing currents I1 to I6 of six-phase alternating-current into the twelve split coils L1 to L12.

DETAILED DESCRIPTION OF THE PREFERRED EMBODIMENTS

Preferred embodiments according to the present invention will be described below with reference to the attached drawings.

FIRST PREFERRED EMBODIMENT

Figure 1:
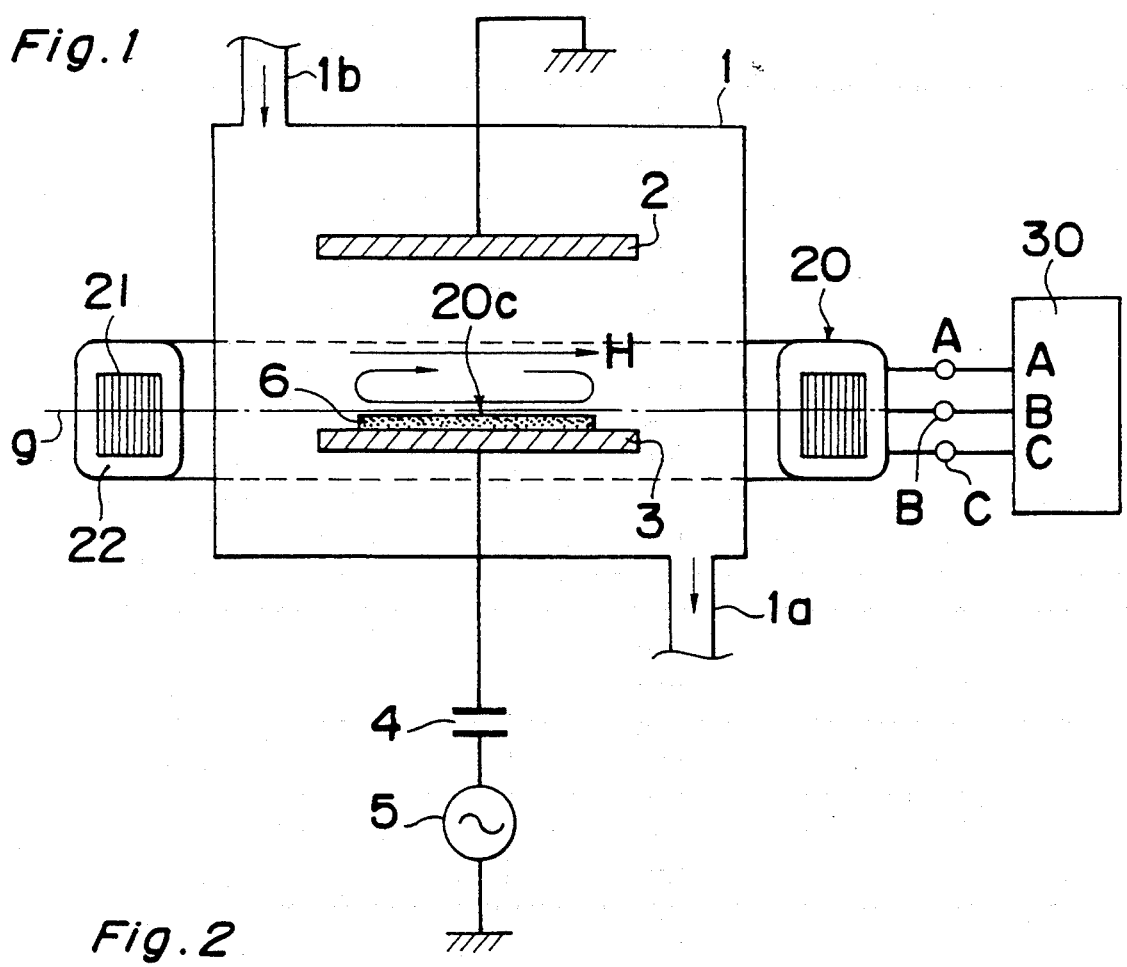
FIG. 1 is a schematic longitudinal cross sectional view of a plasma processing apparatus of a first preferred embodiment using an asymmetrical three-phase alternating-current power source, according to the present invention.

FIG. 1 shows a plasma processing apparatus of a first preferred embodiment using an asymmetrical three-phase alternating-current power source 30, according to the present invention.

Figure 6:
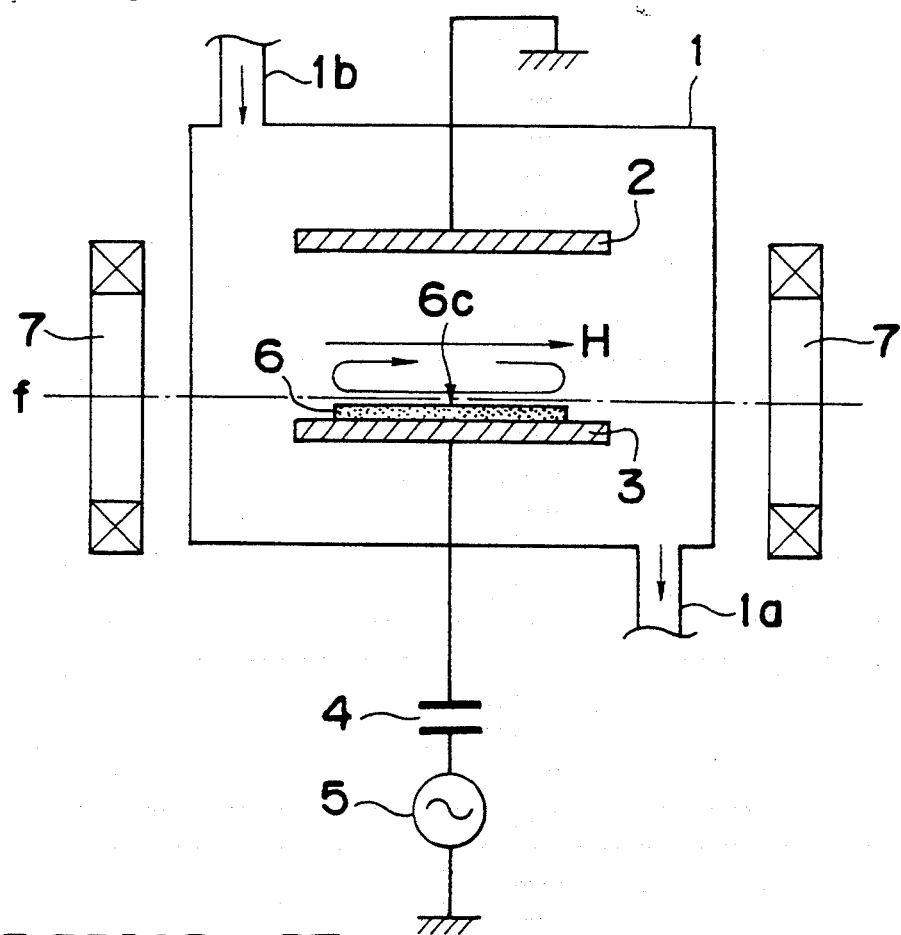
FIG. 6 is a schematic longitudinal cross sectional view of a conventional plasma processing apparatus.
Figure 7:
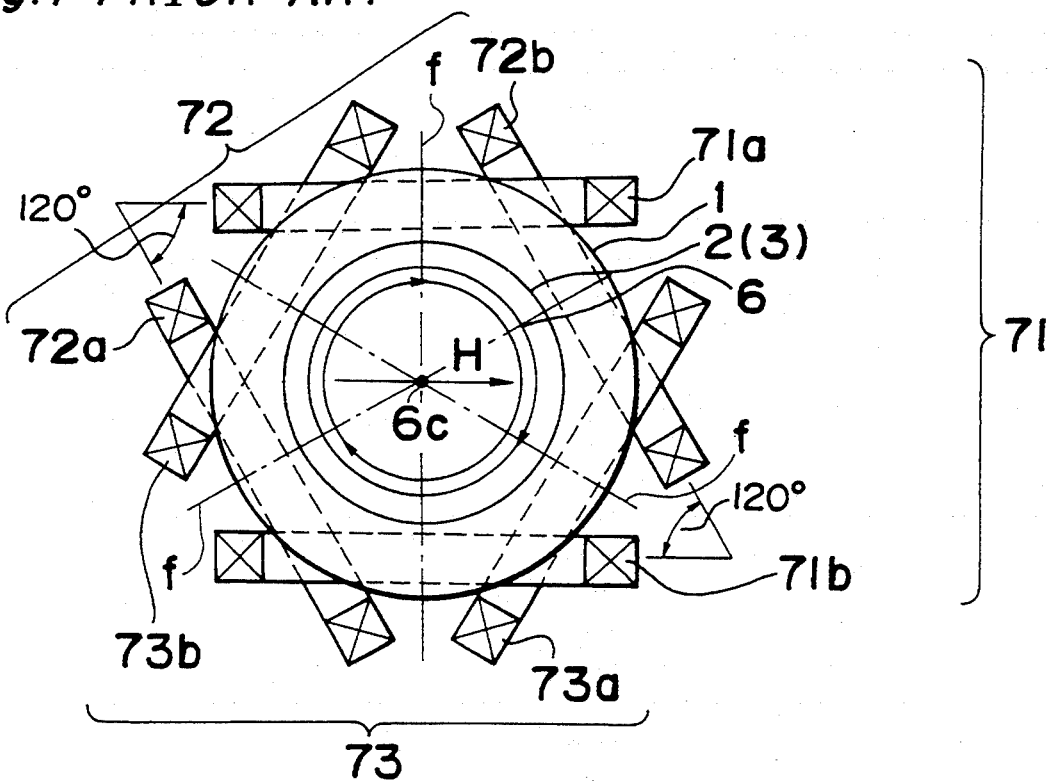
FIG. 7 is a plan view showing an arrangement of three Helmholtz coils for generating a rotating magnetic field which are used in the conventional plasma processing apparatus shown in FIG. 6.

Referring to FIG. 1, the plasma processing apparatus of the first preferred embodiment comprising the cylinder-shaped processing chamber 1, the anode electrode 2, the cathode electrode 3, the coupling capacitor 4, the high frequency power source 5, and the circular-plate-shaped processing substrate 6, is constituted in a manner similar to that of the conventional plasma processing apparatus shown in FIG. 6. That is, there is provided in the processing chamber 1, the anode electrode 2 and the cathode electrode 3 which are plane-parallel electrodes, wherein the anode electrode 2 is electrically connected to ground. The cathode electrode 3 is connected through the coupling capacitor 4 to the high frequency power source 5, and the processing substrate 6 is placed on the cathode electrode 3 axially to the processing chamber 1.

A toroidal coil 20 is provided as means for generating a rotating magnetic field, which comprises a circular ring-shaped core 21 and split coils 22 wound about the ring-shaped core 21, and the toroidal coil 20 is provided about the processing chamber 1 so as to be close to the periphery of the processing chamber 1 and so that the central surface g in the vertical direction of the toroidal coil 20 passes through an area close to the processing surface of the processing substrate 6. The ring-shaped core 21 of the toroidal coil 20 is made by winding a strip-shaped silicon steel plate, and also may be made by forming a silicon steel plate into a circular ring shape, obtaining a plurality of ring-shaped steel plate and laminating them on each other.

The split coils 22 of the toroidal coil 20 are comprised of six split coils L1 to L6, the respective split coils L1 to L6 having the same magnetomotive forces as each other, and the split coils L1 to L6 are uniformly wound about the ring-shaped core 21, preferably without substantially any gap between the adjacent split coils 22.

Figure 2:
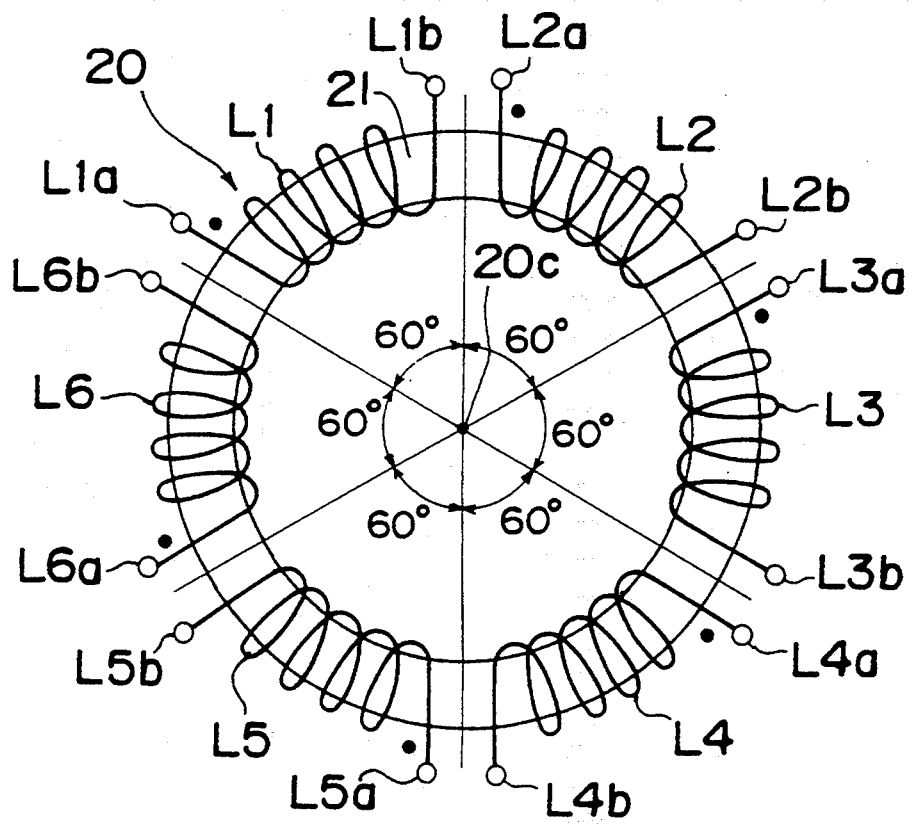
FIG. 2 is a plan view schematically showing a toroidal coil 20 comprising six split coils L1 to L6 of the plasma processing apparatus shown in FIG. 1.

FIG. 2 schematically shows an arrangement of the toroidal coil 20 comprising six split coils L1 to L6 of the plasma processing apparatus shown in FIG. 1.

Referring to FIG. 2, the six split coils L1 to L6 are provided respectively in six areas into which the circular-ring-shaped core 21 is divided by sixty degrees about the center 20c of the toroidal coil 20, and all the six split coils L1 to L6 are wound in the same directions as each other in the periphery direction of the ring-shaped core 21. Then, in both ends of the respective split coils L1 to L6, there are respectively provided winding start ends L1a to L6a and winding completion ends L1b to L6b. In this case, the split coils L1 and L4 are provided at positions of a relative angle of 180 degrees so as to oppose to each other, the split coils L2 and L5 are provided at positions of a relative angle of 180 degrees so as to oppose to each other, and the split coils L3 and L6 are provided at positions of a relative angle of 180 degrees so as to oppose to each other. Hereinafter, two split coils opposing to each other are referred to as each pair of split coils opposing to each other.

Referring back to FIG. 1, there is further provided the alternating-current power source 30 for generating a magnetic field, which is capable of selecting a supply voltage, a supply current, a frequency of alternating-current, a number of phases thereof. In the present preferred embodiment, the alternating-current power source 30 which is an asymmetrical three-phase alternating-current current power source generates and supplies three currents I1, I2 and I3 of asymmetrical three-phase alternating-current having a phase difference of $\pi/3$ which are represented by the following equations (5), (6) and (7).

$$I1 = I \sin \omega t \quad (5)$$

$$I2 = I \sin (\omega t - \pi/3) \quad (6)$$

$$I3 = I \sin (\omega t - 2\pi/3) \quad (7)$$

Figure 3:
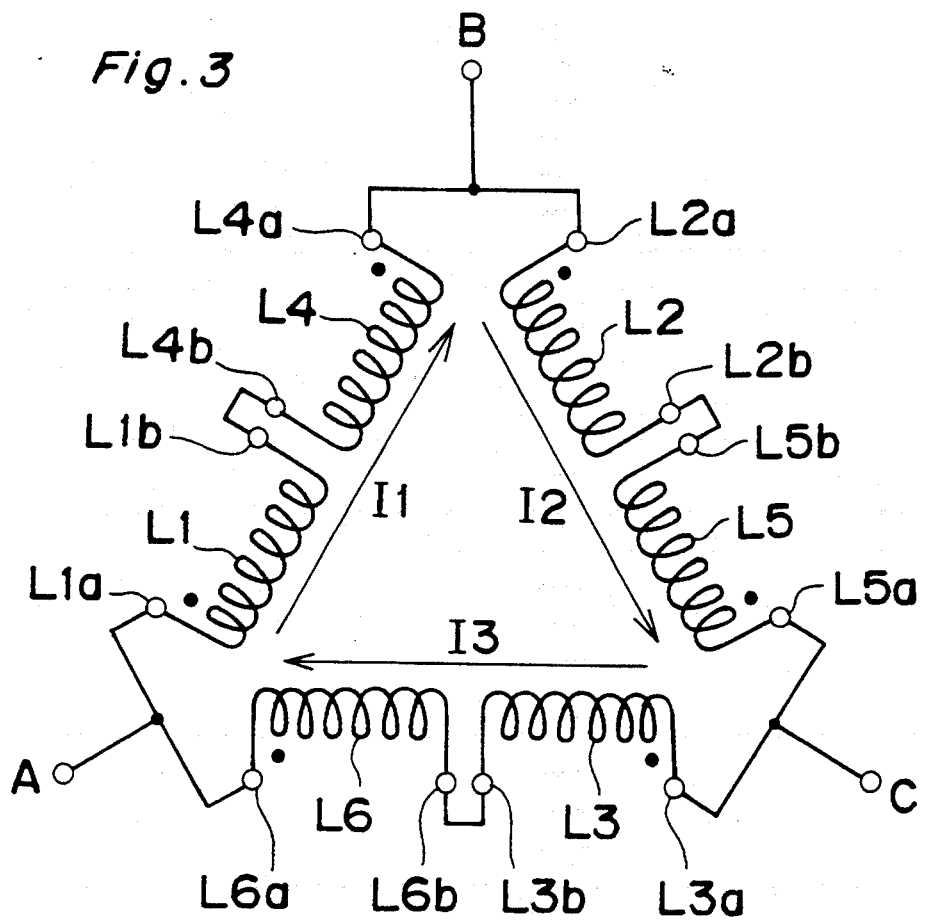
FIG. 3 is a circuit diagram of the toroidal coil 20 showing a method of electrically connecting the six split coils L1 to L6 connected in a delta connection, and a method of flowing three currents I1 to I3 of asymmetrical three-phase alternating-current into the six split coils L1 to L6.

On the other hand, the above-mentioned six split coils L1 to L6 are electrically connected as shown in FIG. 3, so that each pair of split coils L1 and L4, L2 and L5, L3 and L6 each pair opposing to each other are electrically connected in series, respectively, and three pairs of split coils connected in series are electrically connected in a delta connection so as to correspond to three currents I1 to I3 of the three-phase alternating-current of the alternating-current power source 30.

That is, referring to FIG. 3, since the winding directions of all the split coils L1 to L6 are the same as each other, a pair of split coils L1 and L4, L2 and L5, L3 and L6, which oppose to each other, namely, are located at a relative angle of 180 degrees, are electrically connected as follows.

The winding completion end L1b of the split coil L1 is electrically connected to the winding completion end L4b of the split coil L4, the winding completion end L2b of the split coil L2 is electrically connected to the winding completion end L5b of the split coil L5, and the winding completion end L3b of the split coil L3 is electrically connected to the winding completion end L6b of the split coil L6.

Further, the winding start end L1a of the split coil L1 is electrically connected to the winding start end L6a of the split coil L6, and the connection point A between the ends L1a and L6a is electrically connected to a phase A output terminal of the alternating-current power source 30. The winding start end L2a of the split coil L2 is electrically connected to the winding start end L4a of the split coil L4, and the connection point B between the ends L2a and L4a is electrically connected to a phase B output terminal of the alternating-current power source 30. The winding start end L3a of the split coil L3 is electrically connected to the winding start end L5a of the split coil L5, and the connection point C between the ends L3a and L5a is electrically connected to a phase C output terminal of the alternating-current power source 30.

In this case, as shown in FIG. 3, the above-mentioned current I1 represented by the equation (5) is flowed into a pair of split coils L1 and L4 connected in series which oppose to each other, the above-mentioned current I2 represented by the equation (6) is flowed into a pair of split coils L2 and L5 connected in series which oppose to each other, and the above-mentioned current I3 represented by the equation (7) is flowed into a pair of split coils L3 and L6 connected in series which oppose to each other.

In order to explain generation of a rotating magnetic field using the plasma processing apparatus as constituted thus, this explanation is effected hereinafter, for the sake of convenience of the explanation, by each pair of split coils.

Figure 4:
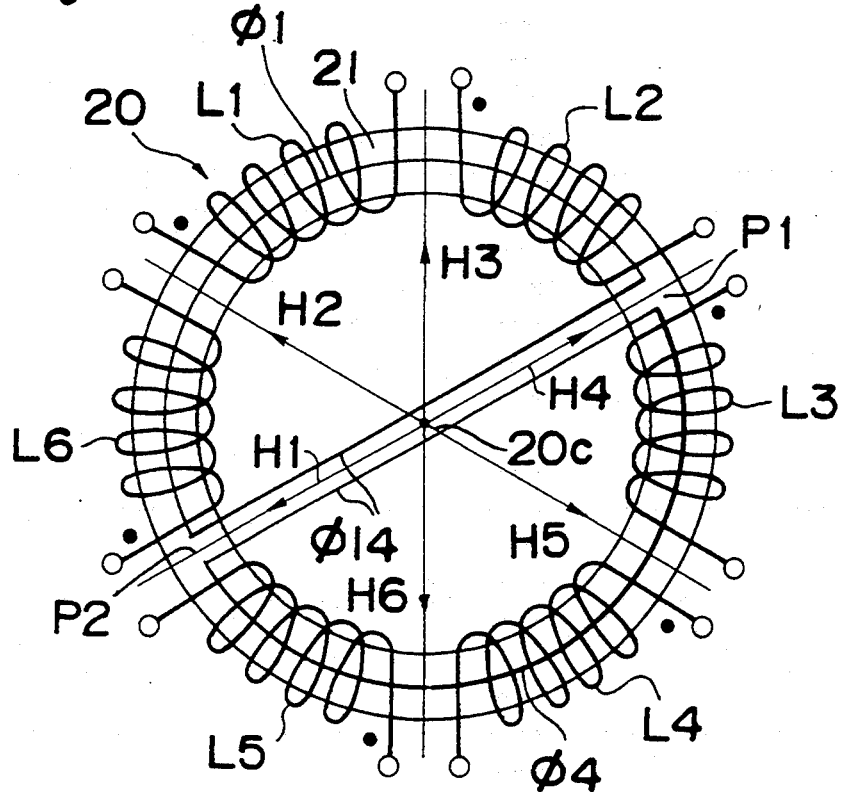
FIG. 4 is a plan view of the toroidal coil 20 showing generation of a rotating magnetic field by generating respective magnetic fields Hi to H6 when a direct-current current is flowed into each pair of split coils opposing each other, of the toroidal coil 20 shown in FIG. 2.

Referring to FIG. 4, first of all, for example, when a direct-current voltage is applied between the winding start ends L1a and L4a so that the current of the direct-current is flowed into a pair of split coils L1 and L4, main magnetic fluxes $\phi 1$ and $\phi 4$ are respectively generated by a pair of split coils L1 and L4, and then go to a middle point P1 in the ring-shaped core 21 between both the coils L1 and L4 so that the magnetic fluxes $\phi 1$ and $\phi 4$ collide with each other at the middle point P1, resulting in a combined magnetic flux $\phi 14$ of the main magnetic fluxes $\phi 1$ and $\phi 4$ at the middle point P1. Then the combined magnetic flux $\phi 14$ goes out from the middle point P1 of the ring-shaped core 21 into an air toward the center 20c of the toroidal coil 20 which is coincides with the center of the space formed by the ring-shaped core 21, and passes through the center 20c of the toroidal coil 20, then goes again into the ring-shaped core 21 and reaches to another middle point P2 opposing to the middle point P1, namely, being located at a relative angle of 180 degrees from the middle point P1. Then, at another middle point P2, the combined magnetic flux $\phi 14$ is divided into two magnetic fluxes $\phi 91$ and $\phi 4$ having directions opposite to each other, which then flow into the ring-shaped core 21 within the coils L1 and L4. Thus, a closed magnetic circuit is formed in a half circle of the toroidal coil 20 by the coil L1, and another closed magnetic circuit is formed in another half circle of the toroidal coil 20 by the coil L4.

This results in generating a combined magnetic field H1 in a direction directed from the middle point P1 to the middle point P2, as shown in FIG. 4.

on the other hand, when the above-mentioned direct-current flowed into a pair of split coils L1 and L4 is inverted, a magnetic field H4 having a direction opposite to that of the magnetic field H1 is generated.

Thus, the current of the direct-current is flowed into a pair of split coils L1 and L4, and it is flowed into a pair of split coils L2 and L5, then it is flowed into a pair of split coils L3 and L6. Thereafter, the inverted current of the direct-current is flowed into these split coils in the above-mentioned order. In this case, a magnetic field is generated in an order of H1→H2→H3→H4→H5→H6, so that the magnetic field is generated rotating the direction of the magnetic field by 60 degrees about the center 20c of the toroidal coil 20. In other words, a rotating magnetic field is generated which rotates in a clockwise direction by one rotation when seen from the top of the toroidal coil 20.

on the other hand, when a high-frequency voltage is applied between the anode electrode 2 and the cathode electrode 3 which are plane-parallel electrodes by the high frequency power source 5, a high frequency electric field is generated between the plane-parallel electrodes 2 and 3. Further, a desirable processing gas is flowed into the processing chamber 1 in a manner similar to that of the conventional plasma processing apparatus. Then a plasma is generated on the processing substrate 6, and then is used to perform various kinds of processes for the processing substrate 6.

In the present preferred embodiment, the current I1 of the alternating-current represented by the equation (5) is flowed into a pair of split coils L1 and L4, the current I2 of the alternating-current represented by the equation (6) is flowed into a pair of split coils L2 and L5, and the current I3 of the alternating-current represented by the equation (7) is flowed into a pair of split coils L3 and L6. In this case, the intensity H of the combined magnetic field becomes constant as the time proceeds, and then a rotating magnetic field of the combined magnetic field can be generated which rotates in a clockwise direction with a predetermined angular velocity.

In the present preferred embodiment, the frequency of the rotating frequency is preferably set to about 0.1 to about 3 Hz.

Figure 5:
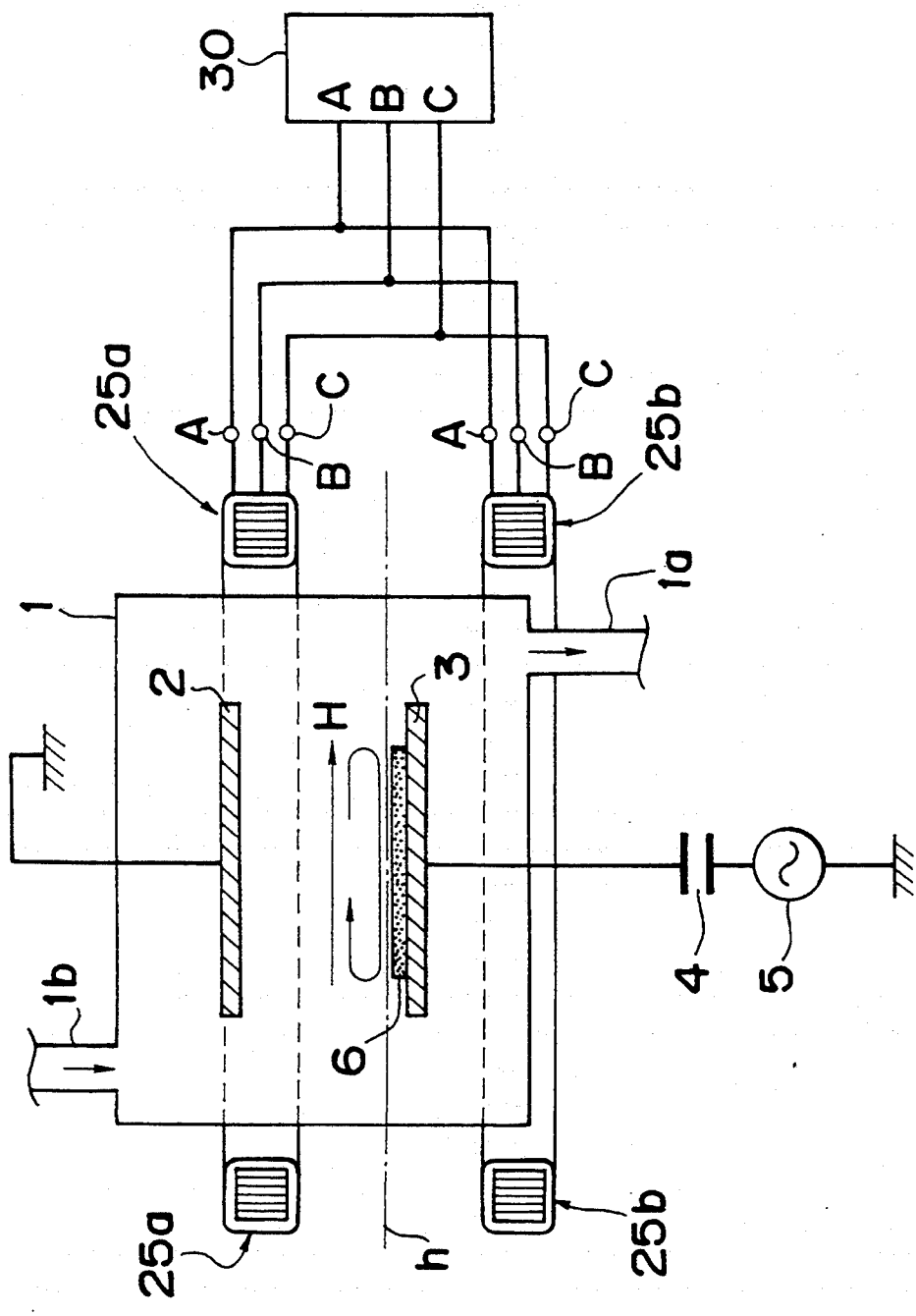
FIG. 5 is a schematic longitudinal cross sectional view of a plasma processing apparatus of a first modification of the first preferred embodiment according to the present invention.

FIG. 5 shows a plasma processing apparatus of a first modification of the first preferred embodiment according to the present invention. In FIG. 5, the same components as those shown in FIGS. 1 to 4 are denoted the same references as those shown in FIGS. 1 to 4.

Referring to FIG. 5, the plasma processing apparatus of the first modification is characterized in that the toroidal coil 20 of the first preferred embodiment shown in FIG. 1 is divided into two toroidal coils 25a and 25b in the vertical direction or the up and down directions so that the toroidal coil 25a is apart from the toroidal coil 25b with a gap therebetween.

When the processing surface of the processing substrate 6 is positioned on a middle surface h between the two toroidal coils 25a and 25b, a component of the combined magnetic field perpendicular to the processing surface thereof which are located on the middle surface h (referred to as a component on the middle surface h hereinafter) have the same magnitudes as each other, and have directions opposite to each other. In this case, the component on the middle surface h are cancelled by each other, resulting in generating no magnetic field component in the direction perpendicular to the processing surface of the processing substrate 6.

In the first modification, the gap between the toroidal coils 25a and 25b which are provided at the upper and lower positions may be changed so that the uniformity of the distribution of the magnetic density on the middle surface h becomes further improved.

In the above-mentioned first preferred embodiment, the winding directions of all the split coils L1 to L6 are the same as each other. However, the present invention is not limited to this.

Figure 8:
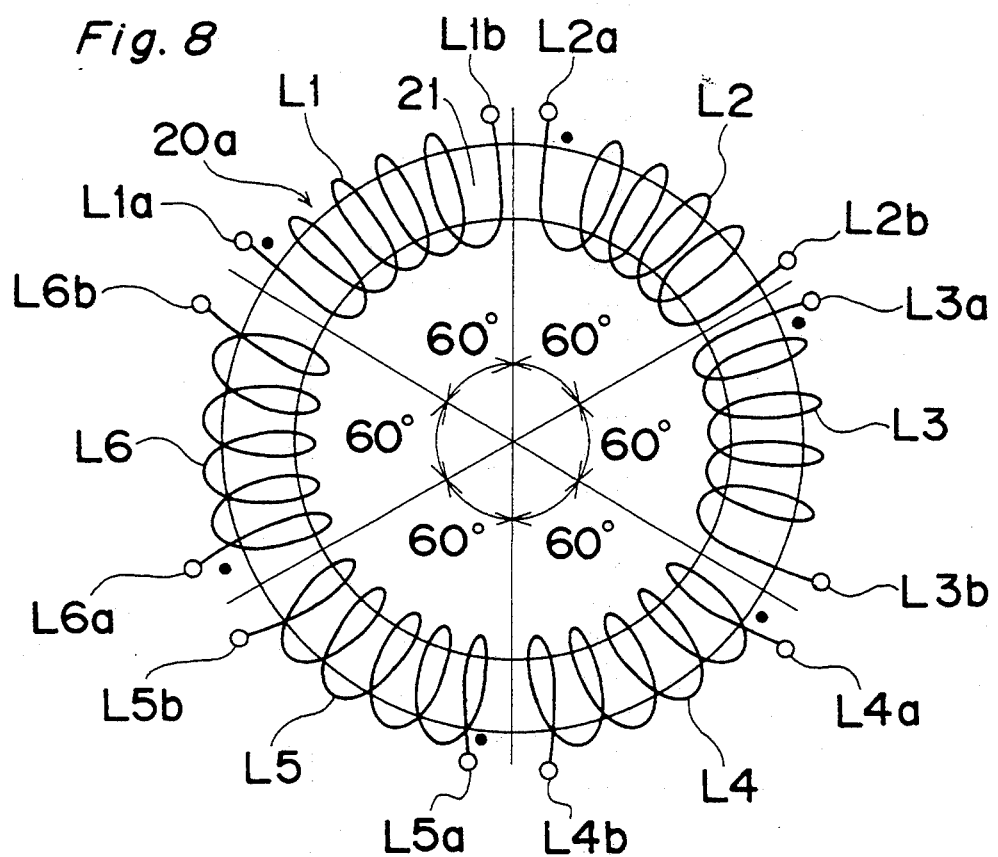
FIG. 8 is a plan view schematically showing a toroidal coil 20a comprising six split coils L1 to L6 of a plasma processing apparatus of a second modification of the first preferred embodiment according to the present invention.
Figure 9:
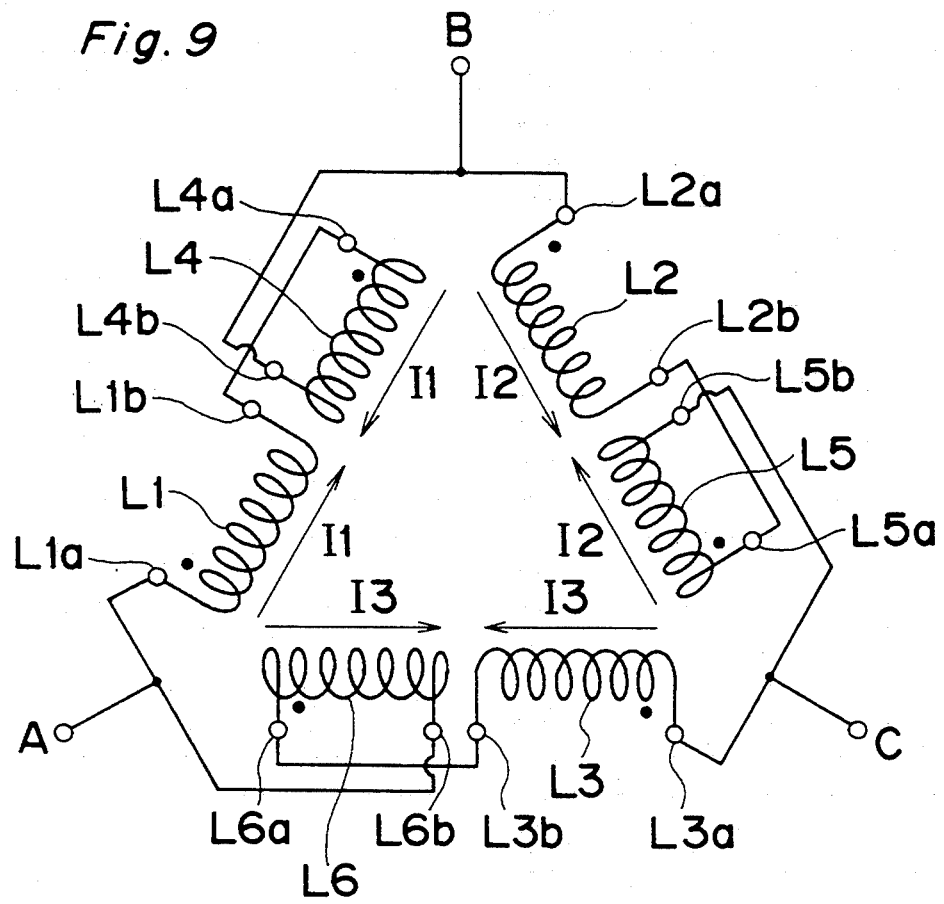
FIG. 9 is a circuit diagram of the toroidal coil 20a showing a method of electrically connecting the six split coils L1 to L6 connected in a delta connection, and a method of flowing currents I1 to I3 of three-phase alternating-current into the six split coils L1 to L6.

For example, as shown in a toroidal coil 20a of a second modification of FIG. 8, the winding directions of the split coils L1, L2 and L3 may be the same as each other while the winding directions of the split coils L4, L5 and L6 may be the same as each other but opposite to those of the split coils L1, L2 and L3, and then, the six split coils L1 to L6 may be electrically connected to each other and connected to the asymmetrical three-phase alternating-current power source 30 as shown in FIG. 9, as follows.

That is, the winding completion end L1b of the split coil L1 is electrically connected to the winding start end L4a of the split coil L4, the winding completion end L2b of the split coil L2 is electrically connected to the winding start end L5a of the split coil L5, and further, the winding completion end L3b of the split coil L3 is electrically connected to the winding start end L6a of the split coil L6. The winding start end L1a of the split coil L1 and the winding completion end L6b of the split coil L6 are electrically connected to each other and are connected to the phase A output terminal of the alternating-current power source 30. Also, the winding start end L2a of the split coil L2 and the winding completion end L4b of the split coil L4 are electrically connected to each other and are connected to the phase B output terminal of the alternating-current power source 30. Further, the winding start end L3a of the split coil L3 and the winding completion end L5b of the split coil L5 are electrically connected to each other and are connected to the phase C output terminal of the alternating-current power source 30.

In the plasma processing apparatus of the second modification comprising the toroidal coil 20a, which is constituted as described above, a rotating magnetic field is generated in a manner similar to that of the first preferred embodiment.

SECOND PREFERRED EMBODIMENT

Figure 10:
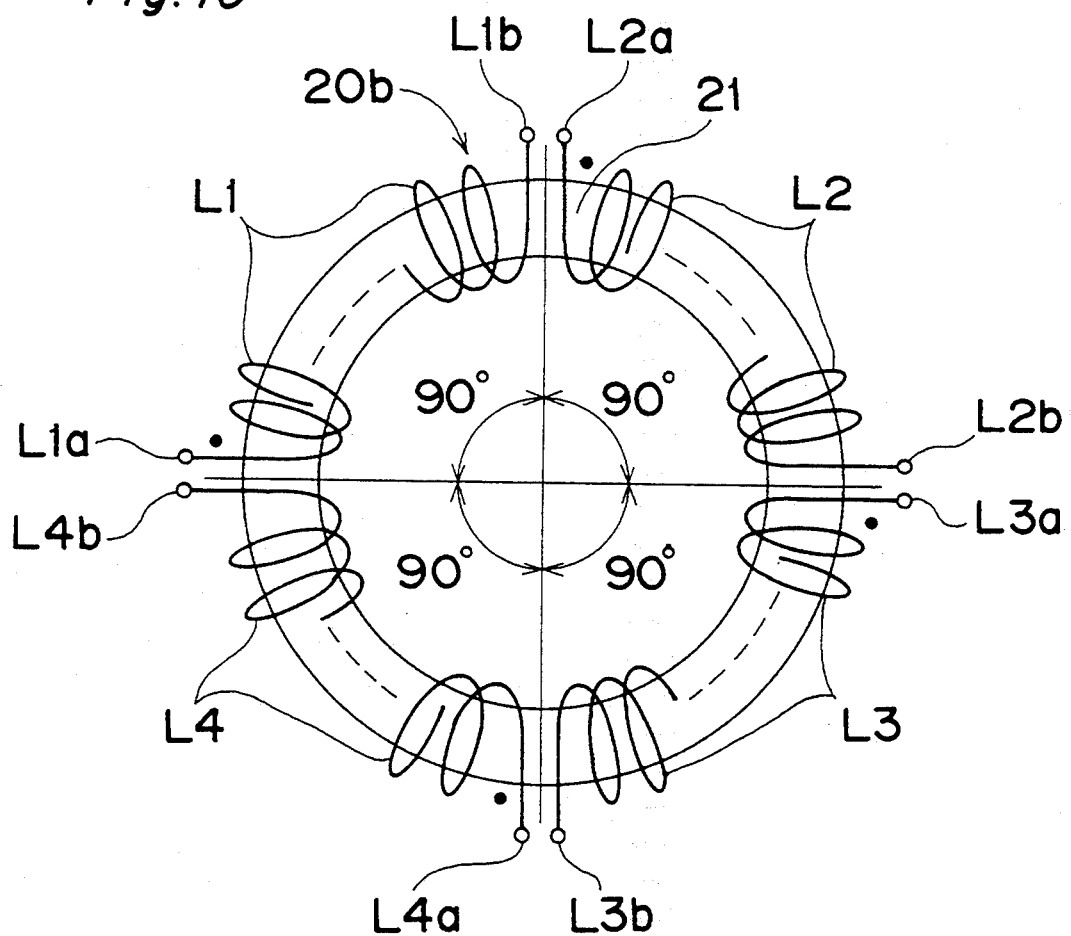
FIG. 10 is a plan view schematically showing a toroidal coil 20b comprising four split coils L1 to L4 of a plasma processing apparatus of a second preferred embodiment using an asymmetrical two-phase alternating-current power source, according to the present invention.
Figure 11:
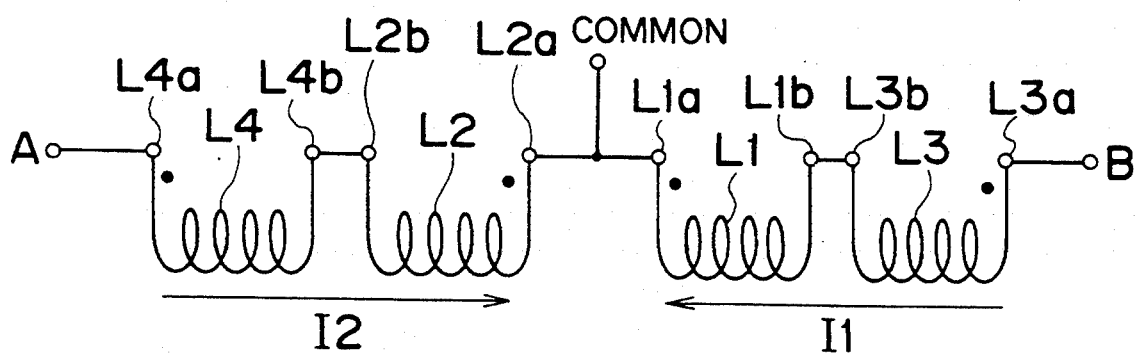
FIG. 11 is a circuit diagram of the toroidal coil 20b showing a method of electrically connecting the four split coils L1 to L4, and a method of flowing currents I1 and I2 of two-phase alternating-current into the four split coils L1 to L4.

FIG. 10 schematically shows a toroidal coil 20b comprising four split coils L1 to L4 of a plasma processing apparatus of a second preferred embodiment using an asymmetrical two-phase alternating-current power source, according to the present invention, and FIG. 11 is a circuit diagram of the toroidal coil 20b showing a method of electrically connecting the four split coils L1 to L4, and a method of flowing currents I1 and I2 of two-phase alternating-current into the four split coils L1 to L4. In FIGS. 10 and 11, the same components as those shown in FIGS. 1 to 4 are denoted the same references as those shown in FIGS. 1 to 4.

Hereinafter, only the differences between the second and first preferred embodiments will be described in detail with respect to the composition of the second preferred embodiment.

Referring to FIG. 10, the ring-shaped core 21 is divided into respective four areas each having an angle of 90 degrees about the center of the space formed by the ring-shaped core 21, and then the split coils L1 to L4 are respectively wound in the same direction in the above-divided respective areas.

On the other hand, referring to FIG. 11, the winding completion end L1b of the split coil L1 and the winding completion end L3b of the split coil L3 are electrically connected to each other, and the winding completion end L2b of the split coil L2 and the winding completion end L4b of the split coil L4 are electrically connected to each other. Further, the winding start end L1a of the split coil L1 and the winding start end L2a of the split coil L2 are electrically connected to each other, and also connected to a common output terminal of the asymmetrical two-phase alternating-current power source (not shown). Also, the winding start end L4a of the split coil L4 is electrically connected to a phase A output terminal of the asymmetrical two-phase alternating-current power source, and the winding start end L3a of the split coil L3 is electrically connected to a phase B output terminal of the asymmetrical two-phase alternating-current power source.

In the plasma processing apparatus of the second preferred embodiment, from the above-mentioned asymmetrical two-phase alternating-current power source, a current I1 represented by the following equation (8) is flowed into a pair of split coils L1 and L3 opposing to each other, and a current I2 represented by the following equation (9) is flowed into a pair of split coils L2 and L4 opposing to each other.

$$I1 = I \sin \omega t \quad (8)$$

$$I2 = I \sin (\omega t - \pi/2) \quad (9)$$

In the plasma processing apparatus of the second preferred embodiment constituted as described above, a rotating magnetic field can be generated in a manner similar to that of the first preferred embodiment.

In a manner similar to that of the above-mentioned second modification, the winding directions of the split coils L1 and L2 may be opposite to those of the split coils L3 and L4, and the connection relationship of the series connection between a pair of split coils L1 and L3 opposing to each other and that between a pair of split coils L2 and L4 opposing to each other may be different from those of the second preferred embodiment.

THIRD PREFERRED EMBODIMENT

FIG. 12 schematically shows a toroidal coil 20c comprising eight split coils L1 to L8 of a plasma processing apparatus of a third preferred embodiment using an asymmetrical four-phase alternating-current power source, according to the present invention, and FIG. 13 is a circuit diagram of the toroidal coil 20c showing a method of electrically connecting the eight split coils L1 to L8, and a method of flowing currents I1 to I4 of four-phase alternating-current into the eight split coils L1 to L8. In FIGS. 12 and 13, the same components as those shown in FIGS. 1 to 4 are denoted the same references as those shown in FIGS. 1 to 4.

Hereinafter, only the differences between the third and first preferred embodiments will be described in detail with respect to the composition of the third preferred embodiment.

Referring to FIG. 12, the ring-shaped core 21 is divided into respective areas each having an angle of 45 degrees about the center of the space formed by the ring-shaped core 21, and then the eight split coils L1 to L8 are respectively wound in the same direction in the above-divided respective eight areas. On the other hand, as shown in FIG. 13, the eight split coils L1 to L8 are electrically connected to the asymmetrical four-phase alternating-current power source (not shown).

In the plasma processing apparatus of the third preferred embodiment, from the above-mentioned asymmetrical four-phase alternating-current power source, (a) a current I1 represented by the following equation (10) is flowed into a pair of split coils L1 and L5 opposing to each other;

(b) a current I2 represented by the following equation (11) is flowed into a pair of split coils L2 and L6 opposing to each other;

(c) a current I3 represented by the following equation (12) is flowed into a pair of split coils L3 and L7 opposing to each other; and (d) a current I4 represented by the following equation (13) is flowed into a pair of split coils L4 and L8 opposing to each other.

$$I1 = I \sin \omega t \quad (10)$$

$$I2 = I \sin (\omega t - \pi/4) \quad (11)$$

$$I3 = I \sin (\omega t - 2\pi/4) \quad (12)$$

$$I4 = I \sin (\omega t - 3\pi/4) \quad (13)$$

In the plasma processing apparatus of the third preferred embodiment constituted as described above, a rotating magnetic field can be generated in a manner similar to that of the first preferred embodiment.

In a manner similar to that of the above-mentioned second modification, the winding directions of each pair of split coils opposing to each other may be opposite to each other, and the connection relationships of the series connections between respective pairs of split coils opposing to each other may be different from those of the third preferred embodiment.

FOURTH PREFERRED EMBODIMENT

FIG. 14 schematically shows a toroidal coil 20d comprising twelve split coils L1 to L12 of a plasma processing apparatus of a fourth preferred embodiment using an asymmetrical six-phase alternating-current power source, according to the present invention, and FIG. 15 is a circuit diagram of the toroidal coil 20d showing a method of electrically connecting the twelve split coils L1 to L12, and a method of flowing currents I1 to I6 of six-phase alternating-current into the twelve split coils L1 to L12. In FIGS. 14 and 15, the same components as those shown in FIGS. 1 to 4 are denoted the same references as those shown in FIGS. 1 to 4.

Hereinafter, only the differences between the fourth and first preferred embodiments will be described in detail with respect to the composition of the third preferred embodiment.

Referring to FIG. 14, the ring-shaped core 21 is divided into respective twelve areas each having an angle of 30 degrees about the center of the space formed by the ring-shaped core 21, and then the twelve split coils L1 to L12 are respectively wound in the same direction in the above-divided respective eight areas. On the other hand, as shown in FIG. 15, the twelve split coils L1 to L12 are electrically connected to the asymmetrical six-phase alternating-current power source (not shown).

In the plasma processing apparatus of the fourth preferred embodiment, from the above-mentioned asymmetrical six-phase alternating-current power source, (a) a current I1 represented by the following equation (14) is flowed into a pair of split coils L1 and L7 opposing to each other;

(b) a current I2 represented by the following equation (15) is flowed into a pair of split coils L2 and L8 opposing to each other;

(c) a current I3 represented by the following equation (16) is flowed into a pair of split coils L3 and L9 opposing to each other;

(d) a current I4 represented by the following equation (17) is flowed into a pair of split coils L4 and L10 opposing to each other;

(e) a current I5 represented by the following equation (18) is flowed into a pair of split coils L5 and L11 opposing to each other; and (f) a current I6 represented by the following equation (19) is flowed into a pair of split coils L6 and L12 opposing to each other.

$$I1 = I \sin \omega t \quad (14)$$

$$I2 = I \sin (\omega t - \pi/6) \quad (15)$$

$$I3 = I \sin (\omega t - 2\pi/6) \quad (16)$$

$$I4 = I \sin (\omega t - 3\pi/6) \quad (17)$$

$$I5 = I \sin (\omega t - 4\pi/6) \quad (18)$$

$$I6 = I \sin (\omega t - 5\pi/6) \quad (19)$$

In the plasma processing apparatus of the fourth preferred embodiment constituted as described above, a rotating magnetic field can be generated in a manner similar to that of the first preferred embodiment.

In a manner similar to that of the above-mentioned second modification, the winding directions of each pair of split coils opposing to each other may be opposite to each other, and the connection relationships of the series connections between respective pairs of split coils opposing to each other may be different from those of the fourth preferred embodiment.

OTHER PREFERRED EMBODIMENTS

As is apparent from the disclosures of the above-mentioned first to fourth preferred embodiments, the present invention can be applied to a plasma processing apparatus comprising a plurality of n-phase asymmetrical alternating-current power source for generating and supplying a plurality of n currents having a phase difference of $\pi/n$ therebetween and a toroidal coil including an even number $2n$ more than four of split coils. In this case, the ring-shaped core 21 is divided into respective $2n$ areas having an angle of $\pi/n$ about the center of the space formed by the ring-shaped core 21, and a number $2n$ of split coils are respectively wound in the divided areas. Further, a plurality of n currents generated by the above-mentioned asymmetrical alternating-current power source are respectively flowed into respective pairs of split coils opposing to each other so that the two magnetic fields generated by the respective pairs of split coils opposing to each other are directed in the same direction in parallel to each other.

Further, a plurality of n-phase symmetrical alternating-current power source can be used for the present invention as follows. A plurality of n currents of the symmetrical n-phase alternating-current having a phase difference of $2\pi/n$ therebetween may be respectively flowed into respective pairs of split coils provided so as to have a spatial angle of $2\pi/n$, resulting in generation of a rotating magnetic field.

For example, in a plasma processing apparatus comprising a symmetrical three-phase alternating-current power source for generating and supplying three currents I1 to I3 respectively represented by the equations (1) to (3), and the toroidal coil 20 including the six split coils L1 to L6 shown in FIGS. 2 to 4, (a) the current I1 represented by the equation (1) is flowed into a pair of split coils L1 and L4 opposing to each other;

(b) the current I2 represented by the equation (2) is flowed into a pair of split coils L3 and L6 opposing to each other; and then (c) the current I3 represented by the equation (3) is flowed into a pair of split coils L2 and L4 opposing to each other. In other words, when the three currents I1 to I3 of the symmetrical three-phase alternating current having a phase difference of $2\pi/3$ therebetween are respectively flowed into the respective pairs of split coils opposing to each other which are provided so as to have a spatial angle of $2\pi/3$, a rotating magnetic field can be generated.

In the above-mentioned preferred embodiments, each of the toroidal coils 20, 20a to 20d is provided so that the central surface in the vertical direction of each of the toroidal coil or coils 20, 20a to 20d is close to the processing surface of the processing substrate 6. However, the present invention is not limited to this. A gap between the central surface of each of the toroidal coil 20, 20a to 20d and the processing surface of the processing substrate 6 may be set to a preferable value depending on the processing conditions and the kind of the process or the like.

According to the preferred embodiments of the present invention, each of the toroidal coils 20, 20a to 20d used as means for generating a rotating magnetic field is provided in the periphery of the processing chamber 1. Therefore, the size and the consumption electric power of the plasma processing apparatus can be reduced as compared with the conventional plasma processing apparatus for generating a rotating magnetic field using the Helmholtz coils 71 to 73. Further, it is unnecessary to manufacture different kinds of coils upon making the plasma processing apparatus of the present preferred embodiments of the present invention, resulting in inexpensive manufacturing cost or forming an inexpensive plasma processing apparatus.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:

a processing chamber;

plate-parallel electrodes, provided in said processing chamber, for generating a high-frequency electric field in response to a high-frequency voltage;

power source means for generating a plurality of n-phase asymmetrical alternating-current currents including a plurality of n currents having a phase difference of $\pi/n$ therebetween;

a ring-shaped core provided in the periphery of said processing chamber, said core defining an axis and an axially extending, interior through opening, said core consisting of a plurality of 2n ring sections, and wherein each of said ring sections has an arcuate length and extends over a substantially equal angular portion of the core;

a toroidal coil including a plurality of 2n split coils is wound onto the core so that each pair of split coils oppose each other; and electrical connection means for electrically connecting said power source means with said plurality of split coils of said toroidal coil so that two magnetic fields generated by said each pair of split coils opposing each other are directed in the same direction in parallel to each other in said processing chamber, and said plurality of currents flow respectively into said respective pairs of split coils opposing each other, thereby generating a rotating magnetic field in parallel to surfaces of said plane-parallel electrodes;

wherein each of the split coils is wound around and extends substantially completely over the entire arcuate length of a respective one of the ring sections, and wherein the rotating magnetic field has a substantially constant magnetic flux density across the interior through opening defined by the core.

2. A plasma processing apparatus comprising:

a processing chamber;

plate parallel electrodes provided in said processing chamber, for generating a high-frequency electric field in response to a high-frequency voltage;

power source means for generating a plurality of n-phase asymmetrical alternating-current currents including a plurality of n currents having a phase difference of $2\pi/n$ therebetween;

ring-shaped core provided in the periphery of said processing chamber, said core defining an axis an a axially extending, interior through opening, said core consisting of a plurality of 2n ring sections, and wherein each of said ring sections has an arcuate length and extends over a substantially equal angular portion of the core;

a toroidal coil including a plurality of 2n split coils wound onto the core so that each pair of split coils oppose each other; and electrical connection means for electrically connecting said power source means with said plurality of split coils of said toroidal coil so that two magnetic fields generated by said each pair of split coils opposing each other are directed in the same direction in parallel to each other in said processing chambers, and said plurality of currents flow respectively into said respective pairs of split coils opposing each other, thereby generating a rotating magnetic field in parallel to surfaces of said plane-parallel electrodes;

wherein each of the split coils is wound around and extends substantially completely over the entire arcuate length of a respective one of the ring sections, and wherein the rotating magnetic field has a substantially constant magnetic plux desity across the interior through opening defined by the core.

* * * * *

UNITED STATES PATENT AND TRADEMARK OFFICE
CERTIFICATE OF CORRECTION

PATENT NO. : 5,440,206
DATED : August 8, 1995
INVENTOR(S) : Yoichi Kurono, et al.

It is certified that error appears in the above-indentified patent and that said Letters Patent is hereby corrected as shown below:

ON THE TITLE PAGE:

In the Abstract, line 1: "processing s" should read --processing apparatus--.

Column 2, lines 54-55: "71, or 73" should read --71, 72 or 73--.

Column 7, line 52: " φ91" should read -- φ1--.

Column 7, line 61: "on" should read --On--.

Column 8, line 10: "on" should read --On--.

Column 10, line 49: "LB" should read --L8--.

Column 14, line 38, Claim 2: "an a" should read --and an--.

Column 14, line 53, Claim 2: "chambers" should read --chamber--

Signed and Sealed this

Twentieth Day of February, 1996

Attest:

BRUCE LEHMAN

*Attesting Officer*      *Commissioner of Patents and Trademarks*